United States Patent

Dubois et al.

[11] 4,068,919
[45] Jan. 17, 1978

[54] METHOD OF MANUFACTURING AN ELECTRON-SENSITIVE RESIN, AND AN APPLICATION OF SAID RESIN TO INTEGRATED OPTICS

[75] Inventors: Jean Claude Dubois; Maryse Gazard; Claude Duchesne; Jean Claude Lavenu, all of Paris, France

[73] Assignee: Thomson-CSF, Paris, France

[21] Appl. No.: 665,250

[22] Filed: Mar. 9, 1976

[30] Foreign Application Priority Data

Mar. 11, 1975 France .............................. 75 07522

[51] Int. Cl.$^2$ .............................................. G02B 5/14
[52] U.S. Cl. ........................ 350/96 WG; 260/46.5 G
[58] Field of Search ............. 260/46.5 R; 350/96 WG

[56] References Cited

U.S. PATENT DOCUMENTS

| 3,017,385 | 1/1962 | Sprung et al. ................ 260/46.5 R |
| 3,767,445 | 10/1973 | Chandross et al. ............ 350/96 WG |
| 3,822,928 | 7/1974 | Smolinsky et al. ............ 350/96 WG |

*Primary Examiner*—Melvyn I. Marquis
*Attorney, Agent, or Firm*—Oblon, Fisher, Spivak, McClelland & Maier

[57] ABSTRACT

A method of manufacturing an electron-sensitive resin capable of constituting the material of an optical waveguide having a width of the order of 1 micron and transmission loss lower than 2 db/cm, is provided. The method comprises, carried out under conditions of extremely high purity, the hydrolysis of trichlorosilane, to give phenylsilanetriol, the preparation of a benzenic collodion of this product and then the polymerization in the hot state of a phenylsilanetriol solution, and the conversion of the resultant polymer into the polyphenylsiloxanol which is fractionated by successive extremely fine filtering operations carried out upon a solution of this product, into batches having different degrees of polymerization, each of them fitting a typical optical waveguide.

5 Claims, No Drawings

METHOD OF MANUFACTURING AN ELECTRON-SENSITIVE RESIN, AND AN APPLICATION OF SAID RESIN TO INTEGRATED OPTICS

The present invention relates to a method of manufacturing an electron-sensitive negative resin, to the application of this resin in integrated optical systems, for fabricating optical waveguides utilizing the said resin.

Such optical waveguides are "microwaveguides" capable of transmitting a light wave, for example a LASER beam of the order of one micron in width, with losses as low as possible.

Those skilled in the art will be aware of various methods of manufacturing optical waveguides integrated into one and the same substrate, for example:

the deposition upon the substrate, along a given path, of inorganic compounds having a matched-refractive index;

the modification of the substrate by ion implantation, to bring about a change in the refractive index in a given region;

the deposition of an organic polymer along a given path, for example by photolithographic techniques, polymerization being brought about by the application of heat or by the use of an electrical discharge in a monomer vapour, etc . . .

The above processes are quite complex and do not really lend themselves to the manufacture of microwaveguides. In particular, in the case of irradiation by visible or ultraviolet radiation, the phenomena of diffraction give rise to edge effects which are unacceptable in the case of microwaveguides because the distortions which then occur at the edges of the optical waveguides give rise to excessively high losses.

It has been proposed that an electronic radiation should be used in order to produce an impression on a sensitive resin layer deposited upon the substrate, for example by a technique of electronic masking, and further more that the microwaveguide should be formed in the sensitive resin itself (a negative resin which becomes insoluble after irradiation and is therefore left behind after development). In particular, those skilled in the art will be aware that polyphenylsiloxanol, after crosslinking has taken place under the influence of the electrons, has a refractive index greater than that of a substrate such as silicate for example, this refractive index being around 1.57.

However, this resin as obtained by conventional manufacturing methods, at the time of transmission through the waveguides gives rise to heavy losses, of the order of 5 decibels per centimetre.

The invention overcomes this drawback and at the same time improves the sensitivity of the resin to electrons.

According to the invention, there is provided a method of manufacturing an electron-sensitive resin, comprising the following steps:

a first step, wherein phenylsilanetriol is obtained by hydrolysis of phenyltrichlorosilane;

a second step, wherein polycondensation of the product obtained in the first step is achieved, by carrying out operations in an azeotropic mixture of diphenyl and diphenyl oxide in the presence of potassium at a temperature in the order of 250° C to 300° C, polymers of phenylsiloxanol being then obtained by the addition of methanol to the solution following cooling;

a third step in which, using successive filtration operations, fractionated separation of polymers of different molecular masses is achieved from the product obtained in the second step, thus obtaining batches of polymers, each of them having a particular mean molecular mass fitting the manufacturing of a typical optical waveguide.

Other features of the invention will become apparent during the course of the ensuing description and from the related examples.

By way of non-limitative example, in the following the three steps (they are complex, comprising multiple operations) of the method of the invention, have been described, in application to a phenyltrichlorosilane mass of around 200 grammes.

First step:

The phenyltrichlorosilane is dissolved in ethyl ether (around 440 ml). Then 120 ml of high-purity water are poured slowly (over a period of 30 minutes) into the solution. Progressive hydrolysis takes place, liberating hydrochloric acid which is eliminated partly by rinsing and successive operations of decantation; the solution is virtually neutral after 1400 ml of pure water being used. Around 400 ml of benzene are added to the layer obtained after decantation. The solution obtained is distilled, in order to drive off the hydrochloric acid, the ether and the water. The resultant product is maintained for 12 hours in an oven heated to 120° C. A benzenic collodion of phenylsilanetriol forms which solidifies at around 80° C. After the solid is crushed, around 120 g of collodion are obtained.

Second step:

The product obtained in the first step is mixed with 30 g of Dow-therm (this is the name for the azeotropic mixture of diphenyl and diphenyl oxide). To the mixture 6.45 ml of potassium methanol (containing 1% of potassium) are added in order to act as a catalyst for polymerization. The system is maintained at a temperature of 300° C for around 1 hour. After cooling, around 2.5 liters of benzene are added. The potassium is then neutralised by the addition of around 1 ml of pure acetic acid. The solution is then processed using carbon black and subsequently filtered with the help of an infusorial earth. The filtrate is then re-dissolved in benzene. The solution is filtered across a diaphragm, the pores in which have a diameter of around 0.2 micron. To the solution, methanol is added which has been filtered using a diaphragm having the same porosity, this bringing about the formation of a pholyphenylsiloxanol precipitate. After filtration, the precipitate is rinsed with methanol and then with pure water. After vacuum drying at 150° C for 12 hours, around 90 g of pure polyphenylsiloxanol are obtained, although this contains aggregates and molecules of different molecular masses.

Third step:

The product obtained in the second step is dissolved in a ratio of 1% by weight, in high-purity benzene. The solution is submitted to a first filtering operation which retains the aggregates, then to three successive fractionating operations using diaphragms whose pores are progressively finer and finer. The percentage masses of aggregates, fractions retained by the diaphragms and the final filtrate, are listed in column C of the following table, column A indicating the type of filtration and column B the nominal retention of the filter expressed in moles of filtration residue. The results have been obtained by applying pressure to the solution being filtered and by agitating the filtration device.

| A - Type of filtering | B - Nominal retention of the filter | C - Masses in % a) fraction retained b) filtrate |
|---|---|---|
| Pores of 0.025 micron | Aggregates | 2.1 (a) |
| Diaphragm 1 | Moles of 100 000 g | 58.3 (a) |
| Diaphragm 2 | Moles of 25 000 g | 25 |
| Diaphragm 3 | Moles of 1 000 g | 12.5 (a) 2.1 (b) |

The fractions retained by the various diaphragms constitute the resin batches which can be used for manufacture of light waveguides.

The method employed to obtain optical waveguides having a width of the order of one micron (2 or 3 microns for example) which are integrated into a substrate, consists in using electronic masking, the "microwaveguide" being formed in the resin zone which has been rendered insoluble by electronic radiation. However, in order to exploit all the advantages of the resin in accordance with the invention, it is fitting to produce the resin deposit in an atmosphere which is saturated with the resin solvent, this making it possible to avoid certain defects of uniformity in the layer due to premature evaporation of the solvent.

In addition, the use of polyphenylsiloxanol having a degree of polymerization comprised within relatively close limits, has the effect of improving the degree of contrast of the resin. This degree of contrast, by analogy with that employed in the photographic art, is here defined by the ratio between the radiation thus required for complete crosslinking of the polymer and the dose for which the "gelling point" (insolubility of at least part of the resin) is reached.

By way of example, one of the fractions collected in the third stage is dissolved, in the ratio of 10% by weight, in high-purity benzene. The solution is filtered at the time of utilization, using a diaphragm the pores in which have a diameter of 0.025 microns. Deposition upon the substrate of the thin film constituting the waveguide takes place by centrifuging using a carrier rotating at high speed, in a benzene atmosphere. The resultant layer is around 0.8 microns in thickness.

Electronic irradiation takes place in accordance with the design recorded in the store of the electronic masking unit, with a charge density of $2.10^{-1}$ to 10 coulombs per cm$^2$ in accordance with the mean molecular mass of the polymer fraction used, the weakest charge being sufficient for molecular masses in excess of 100 000g.

Microwaveguides 2 microns in width have been produced upon a silicate substrate, making it possible to transmit a Helium-Neon LASER beam with light losses of less than 2 db/cm.

What we claim is:

1. A method of preparing an electrosensitive resin which comprises:
   A. hydrolyzing phenyltrichlorosilane to phenylsilanetriol;
   B. polycondensing said phenylsilanetriol by:
      I. heating said phenylsilanetriol to a temperature of from 250 to 300° C in a solution comprising an azeotropic mixture of diphenyl and diphenyl oxide in the presence of potassium;
      II. cooling said solution and then adding methanol to the resulting solution to precipitate the phenylsiloxanol polymers;
   C. fractioning said phenylsiloxanol polymers to obtain polymer fractions having desired mean molecular weight.

2. The method of claim 1, wherein said phenylsilanetriol resulting from said hydrolysis of said phenyltrichlorosilane is dissolved in benzene and heated to 120° C to form a benzenic colloidon of phenylsilanetriol.

3. The method of claim 1 wherein, said polycondensation comprises:
   I. heating said phenylsilanetriol to a temperature of from 250 to 300° C in a solution comprising an azeotropic mixture of diphenyl and diphenyl oxide in the presence of potassium;
   II. cooling and then filtering the resultiang solution through a diaphragm having a pore diamter of about 0.2μ; and
   III. adding methanol to the filtered solution to precipitate the phenylsiloxanol polymers.

4. The method of claim 1 wherein, said fractionation comprises:
   A. forming a 1 wt.% solution of phenylsiloxanol polymers in benzene:
   B. passing the resulting solution through a filter having a pore size of about 0.025μ;
   C. passing the resulting filtrate through a diaphragm having a porosity such that phenylsiloxanol polymers having molecular weight of 100,000 or more are retained on the diaphragm and recovering the retained polymer;
   D. passing the resulting filtrate through additional diaphragms of progressively lower porosity such that polymer fractions of mean molecular weights less 100,00 are obtained.

5. In an optical wave guide integrated into a substrate and formed in a resin, the improvement which comprises an electrosensitive resin prepared by the process which comprises:
   a. hydrolyzing phenyltrichlorosilane to phenylsilanetriol
   b. polycondensing said phenylsilanetriol by:
      i. heating said phenylsilanetriol to a temperature of from 250 to 300° C in a solution comprising an azeotropic mixture of diphenyl and diphenyloxide in the presence of potassium;
      ii. cooling and then adding methanol to the resulting solution to precipitate the phenylsiloxanol polymers;
   c. fractioning said phenylsiloxanol polymers to obtain a polymer fraction having the desired mean molecular weight.

* * * * *